(12) United States Patent
Chen et al.

(10) Patent No.: US 12,745,650 B2
(45) Date of Patent: Sep. 22, 2026

(54) PACKAGE SUBSTRATE AND FABRICATING METHOD THEREOF

(71) Applicant: AaltoSemi Inc., Nanjing City (CN)

(72) Inventors: Min-Yao Chen, Nanjing City (CN); Andrew C. Chang, Nanjing City (CN)

(73) Assignee: AaltoSemi Inc., Nanjing City (CN)

(*) Notice: Subject to any disclaimer, the term of this patent is extended or adjusted under 35 U.S.C. 154(b) by 188 days.

(21) Appl. No.: 18/442,862

(22) Filed: Feb. 15, 2024

(65) Prior Publication Data

US 2024/0282590 A1 Aug. 22, 2024

(30) Foreign Application Priority Data

Feb. 18, 2023 (TW) ................................ 112105986

(51) Int. Cl.

| | |
|---|---|
| ***H05K 1/11*** | (2006.01) |
| ***H10W 70/05*** | (2026.01) |
| ***H10W 70/685*** | (2026.01) |
| *H10P 72/70* | (2026.01) |

(52) U.S. Cl.

CPC ......... *H10W 70/05* (2026.01); *H10W 70/685* (2026.01); *H10P 72/74* (2026.01); *H10P 72/7424* (2026.01)

(58) Field of Classification Search

CPC .... H10P 72/74; H10P 72/7424; H10W 70/05; H10W 70/635; H10W 70/685

USPC ........................................................ 174/262

See application file for complete search history.

(56) References Cited

U.S. PATENT DOCUMENTS

| | | | | |
|---|---|---|---|---|
| 2019/0189550 A1 | | 6/2019 | Kim | |
| 2023/0014913 A1 | * | 1/2023 | Chen .................... | H10W 40/22 |

FOREIGN PATENT DOCUMENTS

| | | | | |
|---|---|---|---|---|
| CN | 110581075 B | * | 11/2021 | .......... H10W 20/435 |

* cited by examiner

*Primary Examiner* — Timothy J Thompson
*Assistant Examiner* — Guillermo J Egoavil
(74) *Attorney, Agent, or Firm* — Jose Cherson Weissbrot

(57) ABSTRACT

A package substrate is provided, in which a first circuit structure and a second circuit structure with the same specification are formed on opposite sides of a core board body, respectively, and a wiring structure of another specification is formed on the first circuit structure. In addition, the number of wiring layers of the second circuit structure is greater than the number of wiring layers of the first circuit structure to form an asymmetric package substrate. Therefore, by configuration of the wiring structure, the problem of warpage caused by uneven stress can be prevented from occurring to the package substrate.

3 Claims, 5 Drawing Sheets

PACKAGE SUBSTRATE AND FABRICATING METHOD THEREOF

CROSS-REFERENCE TO RELATED APPLICATION

This application claims the benefit of priority of Taiwan Patent Application No. 112105986, filed Feb. 18, 2023, the entire contents of which are hereby incorporated by reference.

BACKGROUND

1. Technical Field

The present disclosure relates to a package substrate for carrying chips, and more particularly, to an asymmetric package substrate and a fabricating method thereof.

2. Description of Related Art

Technologies currently used in the field of chip packaging include, for example, a chip scale package (CSP), a direct chip attachment (DCA), a multi-chip module (MCM) and other types of package modules. As the functional requirements of end products increase, semiconductor chips need to have more input/output (I/O) contacts, such that the number of external pads on a package substrate used to carry the semiconductor chips also increases accordingly.

FIG. 1 is a schematic cross-sectional view showing a conventional package substrate 1. As shown in FIG. 1, the package substrate 1 includes a core board body 10 having a first side 10*a* and a second side 10*b* opposing the first side 10*a*. In addition, a first circuit structure 11 is formed on the first side 10*a* of the core board body 10, and a second circuit structure 12 is formed on the second side 10*b* of the core board body 10, wherein the core board body 10 has a plurality of conductive vias 100 communicating with the first side 10*a* and the second side 10*b* to electrically connect the first circuit structure 11 and the second circuit structure 12, and the first circuit structure 11 and the second circuit structure 12 are both fabricated by using a common build-up process to produce circuits with the same line width/line pitch. However, the number of wiring layers of the first circuit structure 11 and the number of wiring layers of the second circuit structure 12 are different to form the asymmetric package substrate 1.

Since the number of wiring layers of the first circuit structure 11 is less than the number of wiring layers of the second circuit structure 12, the coefficient of thermal expansion (CTE) of the second circuit structure 12 is greater than the CTE of the first circuit structure 11. As a result, the package substrate 1 is prone to warping. Therefore, the first circuit structure 11 is configured with a first insulating layer 110 acting as a buffer layer so as to balance the stress distribution of a second insulating layer 120 made of a common dielectric material used in the second circuit structure 12, such that the package substrate 1 will not warp excessively.

However, in the conventional package substrate 1, a buffer material is required to fabricate the first insulating layer 110, which not only increases the fabricating cost, but also the roughness and flatness of the buffer material are different from the roughness and flatness of the common dielectric material. Hence, when using the same equipment/apparatus, the flatness of the first insulating layer 110 and the flatness of the second insulating layer 120 cannot meet the requirements at the same time, resulting in poor accuracy of wiring positions and thus affecting the reliability of subsequent packaging of semiconductor chips.

Furthermore, the surface of the first insulating layer 110 and the surface of the second insulating layer 120 are smoothed by brushing and grinding. However, during the brushing and grinding process, it is easy to cause deformation of the overall structure, and it is easy to brush and grind the surface circuits and cause the circuits to be disconnected. The stress generated by brushing and grinding may even cause the internal circuits to break.

Therefore, how to overcome various problems of the above-mentioned prior art has become a problem urgently to be solved.

SUMMARY

In view of the various shortcomings of the aforementioned prior art, the present disclosure provides a package substrate, which comprises: a core board body having a first side, a second side opposing the first side, and at least one conductive via communicating with the first side and the second side; a first circuit structure disposed on the first side of the core board body and electrically connected to the conductive via; a second circuit structure disposed on the second side of the core board body and electrically connected to the conductive via, wherein a number of wiring layers of the second circuit structure is greater than a number of wiring layers of the first circuit structure, and a specification of the first circuit structure is the same as a specification of the second circuit structure; and a wiring structure disposed on the first circuit structure and electrically connected to the first circuit structure, wherein a specification of the wiring structure is different from the specification of the first circuit structure.

The present disclosure further provides a method of fabricating a package substrate. The method comprises: forming a first circuit layer on a carrier; forming a first insulating layer and a core board body sequentially on the carrier, wherein the first insulating layer is bonded with the carrier to cover the first circuit layer, and the first circuit layer is embedded in the first insulating layer, wherein the core board body has a first side and a second side opposing the first side, the first side of the core board body is bonded with the first insulating layer, and the core board body has at least one conductive via communicating with the first side and the second side; forming a second circuit structure on the second side of the core board body, wherein the second circuit structure has at least one second insulating layer and a second circuit layer bonded with the second insulating layer, and the second circuit layer is electrically connected to the conductive via; removing the carrier to expose the first circuit layer and the first insulating layer; forming a first circuit structure electrically connected to the conductive via by the first insulating layer and the first circuit layer, wherein a specification of the first circuit layer is the same as a specification of the second circuit layer, and a number of wiring layers of the first circuit layer is less than a number of wiring layers of the second circuit layer; and forming a wiring structure on the first circuit structure, wherein the wiring structure has at least one dielectric layer and a redistribution layer bonded with the dielectric layer and electrically connected to the first circuit layer, and a specification of the redistribution layer is different from the specification of the first circuit layer.

In the aforementioned package substrate and method, the core board body, the first insulating layer and the second insulating layer are formed on the carrier in a manner of pressing or laminating.

In the aforementioned package substrate and method, a surface of the first insulating layer is flush with a surface of the first circuit layer.

In the aforementioned package substrate and method, the specification is a line width and/or a line pitch.

In the aforementioned package substrate and method, a coefficient of thermal expansion of the second circuit structure is greater than a coefficient of thermal expansion of the first circuit structure.

It can be seen from the above that the package substrate and the fabricating method thereof of the present disclosure mainly use the wiring structure to replace the conventional buffer layer so as to form a distribution layer (RDL) with extremely small line width/line pitch. Accordingly, the package substrate of the present disclosure can have ultra-fine pitch wiring specifications to facilitate external connection to miniaturized semiconductor chips with multiple contacts.

Moreover, by means of the design of the wiring structure, the CTE of the overall structure on the first side of the core board body and the CTE of the overall structure on the second side of the core board body can be balanced. Consequently, compared with the prior art, the present disclosure not only prevents the package substrate from warping, but also only needs to use a common dielectric material to form the first insulating layer and the second insulating layer. There is no need to use a buffer material to form the first insulating layer or to add a buffer layer on the first side, thereby saving material costs. In addition, when using the same equipment/apparatus, the flatness of the first insulating layer and the flatness of the second insulating layer can meet the requirements at the same time, thereby improving the accuracy of wiring positions.

Furthermore, the fabricating method of the present disclosure bonds the first insulating layer and the second insulating layer having the same material as the first insulating layer with the core board body by pressing or laminating, so as to facilitate the formation of the first insulating layer and the second insulating layer with uniform surface flatness. Therefore, compared with the prior art, the fabricating method of the present disclosure does not require brushing and grinding operations. As such, the present disclosure not only prevents the problem of structural deformation from occurring to the package substrate during the fabricating process, but also does not have the problem of internal circuit breakage due to the stress generated by brushing and grinding. In addition, the present disclosure can also reduce production costs because there is no need to purchase brushing and grinding equipment.

BRIEF DESCRIPTION OF THE DRAWINGS

The embodiments herein may be better understood by referring to the following description in conjunction with the accompanying drawings in which like reference numerals indicate identically or functionally similar elements, of which.

DETAILED DESCRIPTION

Figure 1:
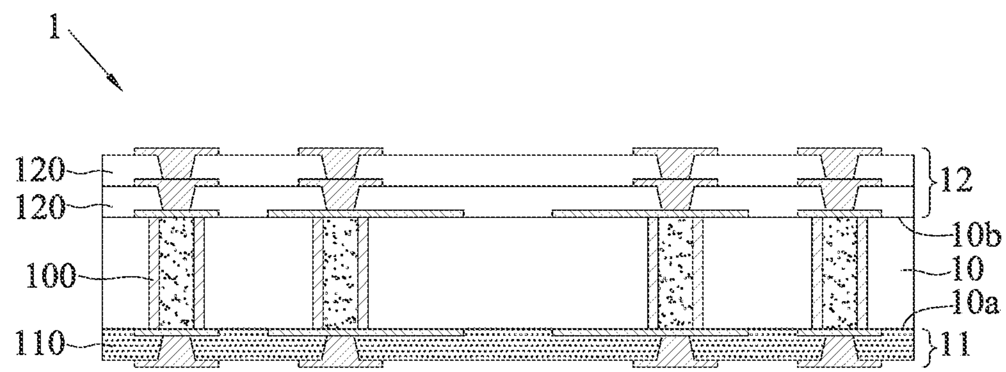
FIG. 1 is a schematic cross-sectional view showing a conventional prior art package substrate.

Implementations of the present disclosure are described below by embodiments. Other advantages and technical effects of the present disclosure can be readily understood by one of ordinary skill in the art upon reading the disclosure of this specification.

It should be noted that the structures, ratios, sizes, etc. shown in the drawings appended to this specification are provided in conjunction with the disclosure of this specification in order to facilitate understanding by those skilled in the art. They are not meant, in any way, to limit the implementations of the present disclosure. Without influencing the effects created and objectives achieved by the present disclosure, any modifications, changes or adjustments to the structures, ratios, or sizes disclosed herein are construed as falling within the scope covered by the technical contents disclosed herein. Meanwhile, terms such as "on," "above," "below," "first," "second," "a," "one," and the like, are for illustrative purposes only, and are not meant to limit the scope of the present disclosure. Any changes or adjustments made to the relative relationships, without substantially modifying the technical contents, are also to be construed as within the scope of the present disclosure.

FIG. 2A to FIG. 2G are schematic cross-sectional views illustrating a method of fabricating a package substrate 2 according to embodiments of the present disclosure.

Figure 2A:
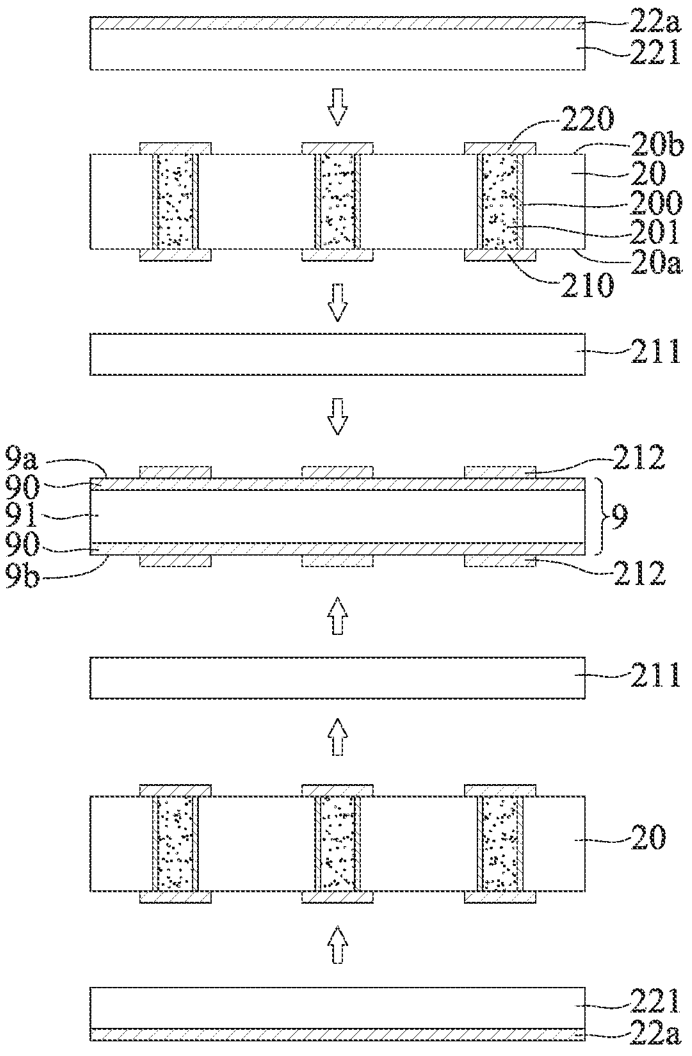
FIG. 2A to FIG. 2G are schematic cross-sectional views illustrating a method of fabricating a package substrate according to the present disclosure.

As shown in FIG. 2A, a carrier 9, a plurality of core board bodies 20, a plurality of first insulating layers 211 and a plurality of second insulating layers 221 having metal layers 22*a* are provided, wherein the carrier 9 is provided with a first surface 9*a* and a second surface 9*b* opposing the first surface 9*a*.

In an embodiment, the carrier 9 may be a temporary carrier plate. A board body 91 of the carrier 9 may be an organic polymerized board (e.g., made of bismaleimide triazine [BT]) or a copper foil substrate. For example, the carrier 9 is a copper foil substrate and includes copper foils 90, and a stripping/peeling layer (not shown) may be formed on each of the copper foils 90 according to requirements.

Moreover, a first circuit layer 212 may be formed on the first surface 9*a* and the second surface 9*b* of the carrier 9.

In addition, the core board body 20 is of a single core layer specification and has a first side 20*a* and a second side 20*b* opposing the first side 20*a*, and a first inner circuit layer 210 and a second inner circuit layer 220 are formed on the first side 20*a* and the second side 20*b* of the core board body 20, respectively, and the core board body 20 has a plurality of conductive vias 200 communicating with the first side 20*a* and the second side 20*b* to electrically connect the first inner circuit layer 210 and the second inner circuit layer 220.

Furthermore, the conductive via 200 is in the form of a hollow column, which may be filled with a plugging material 201 in the hollow space, wherein the plugging material 201 may be of various types, such as, e.g., conductive adhesive, ink, and the like, and is not particularly limited. It should be understood that in other embodiments, the conductive via 200 may also be a solid metal column without being filled with the plugging material 201.

In addition, the first insulating layer 211 and the second insulating layer 221 are dielectric layers, which are made of materials such as, e.g., polybenzoxazole (PBO), polyimide (PI), prepreg (PP), or other dielectric materials, and the metal layer 22*a* may be a copper layer.

Figure 2B:
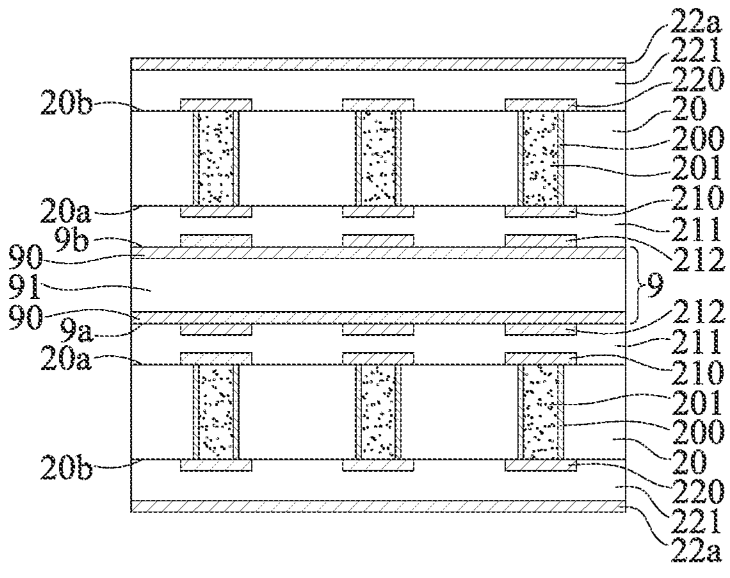

As shown in FIG. 2B, the core board body 20, the first insulating layer 211 and the second insulating layer 221 are formed on the first surface 9*a* of the carrier 9 and on the second surface 9*b* of the carrier 9 symmetrically in a manner of pressing/laminating, such that the first side 20*a* of the core board body 20 is bonded to the first insulating layer 211, and the second side 20*b* of the core board body 20 is bonded to the second insulating layer 221, and the metal layer 22*a* is located at the outermost side.

In an embodiment, the first insulating layer 211 is bonded to each of the first surface 9*a* and the second surface 9*b* of the carrier 9 to encapsulate the first circuit layer 212, such that the first circuit layer 212 is embedded in the first insulating layer 211.

Figure 2C:
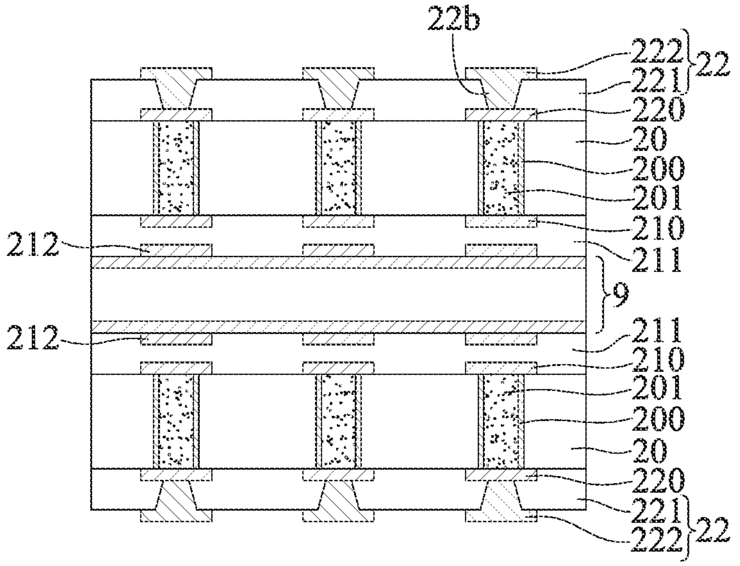

As shown in FIG. 2C, the metal layer 22*a* is patterned to form a second circuit layer 222, and a plurality of second conductive blind vias 22*b* are formed in the second insulating layer 221 to electrically connect the second inner circuit layer 220 and the second circuit layer 222.

In an embodiment, the second circuit layer 222 and the second insulating layer 221 may be used as a second circuit structure 22, such that a second circuit structure 22 is formed on the second side 20*b* of each of the core board bodies 20.

Figure 2D:
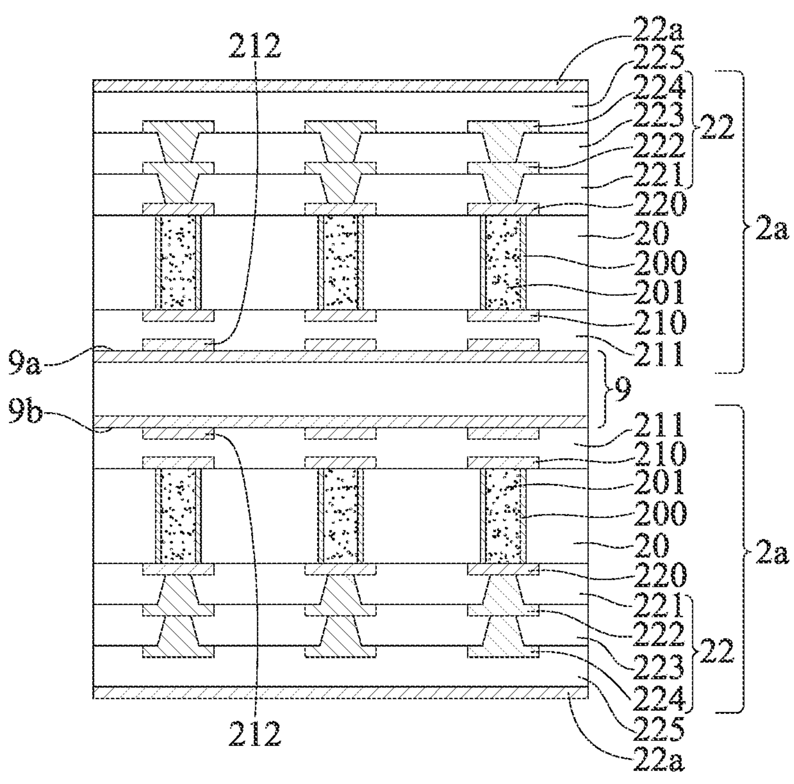

As shown in FIG. 2D, the number of wiring layers of the second circuit structure 22 can be designed according to requirements, such that a second insulating layer 223 having a metal layer can be pressed or laminated on the second circuit layer 222 and the second insulating layer 221 to fabricate a second circuit layer 224 and form an asymmetric substrate structure 2*a*.

In an embodiment, in order to protect the second circuit layer 224, a second insulating layer 225 having the metal layer 22*a* is pressed or laminated on the second circuit layer 224, such that the metal layer 22*a* is presented on the outer side of the second circuit structure 22.

Furthermore, the first insulating layer 211 and the second insulating layers 221, 223, 225 are made of the same material to facilitate the fabrication of the same roughness and flatness.

Figure 2E:
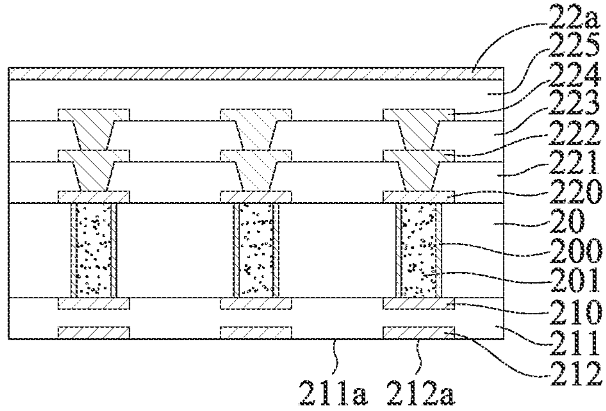

As shown in FIG. 2E, the carrier 9 is removed to expose the first circuit layer 212 and the first insulating layer 211.

In an embodiment, a surface 212*a* of the first circuit layer 212 is flush with a surface 211*a* of the first insulating layer 211.

Figure 2F:
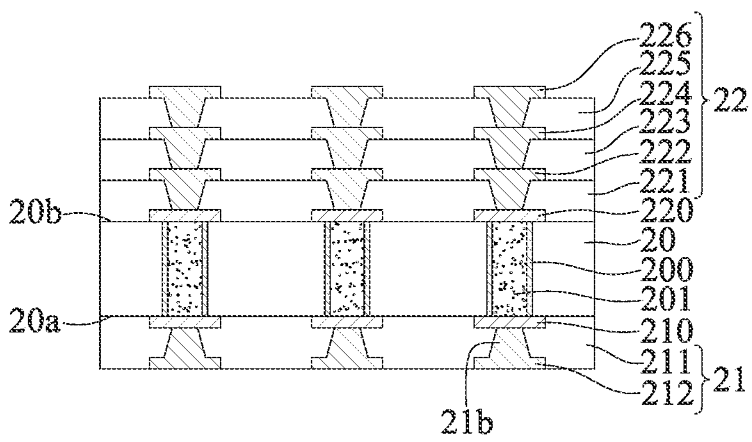

As shown in FIG. 2F, a plurality of first conductive blind vias 21*b* electrically connecting the first inner circuit layer 210 and the first circuit layer 212 are formed in the first insulating layer 211 to form a first circuit structure 21, and the metal layer 22*a* may be patterned according to requirements to form a second circuit layer 226 of the second circuit structure 22, wherein the number of wiring layers of the first circuit structure 21 is less than the number of wiring layers of the second circuit structure 22.

In an embodiment, the first circuit structure 21 includes the first insulating layer 211 and the first circuit layer 212 bonded with the first insulating layer 211, and the second circuit structure 22 includes the plurality of second insulating layers 221, 223, 225 and the second circuit layers 222, 224, 226 bonded with the plurality of second insulating layers 221, 223, 225. Accordingly, the number of wiring layers of the second circuit structure 22 is three, which is more than the number of wiring layers of the first circuit structure 21 (the number of wiring layers of the first circuit structure 21 is one), e.g., the number of wiring layers of the first circuit layer 212 is less than the number of wiring layers of the second circuit layers 222, 224, 226.

Moreover, the specification (e.g., line width/line pitch) of the first circuit layer 212 is the same as the specifications (e.g., line width/line pitch) of the second circuit layers 222, 224, 226.

Furthermore, the coefficient of thermal expansion (CTE) of the second circuit structure 22 is greater than the CTE of the first circuit structure 21.

In addition, the materials of the insulating layers of the first circuit structure 21 and the second circuit structure 22 includes an inorganic material (such as, e.g., silicon oxide, silicon nitride, silicon oxynitride, or other suitable materials) and an organic material (such as, e.g., polyimide [PI], polybenzoxazole [PBO], prepreg [PP], epoxy, benzocyclobutene [BCB], or other suitable materials), and the materials of the circuit layers of the first circuit structure 21 and the second circuit structure 22 are copper or other metals.

Figure 2G:
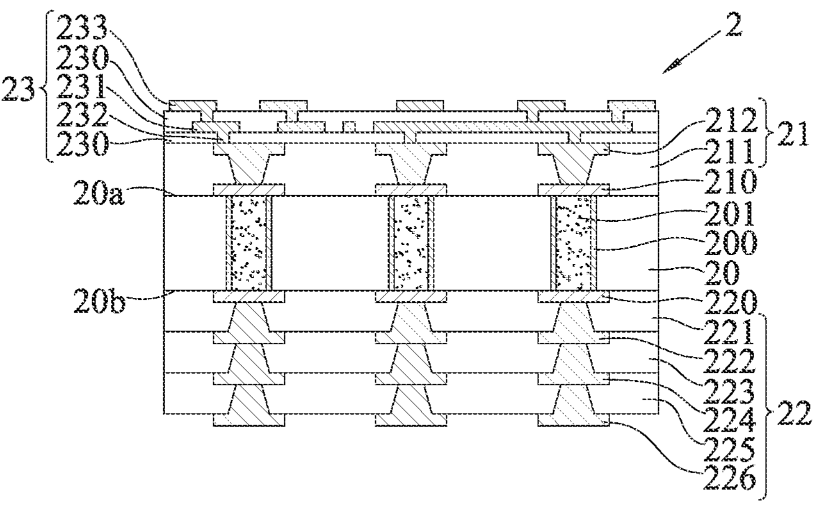

As shown in FIG. 2G, a wiring structure 23 is formed on the first circuit structure 21 by means of a redistribution layer (RDL) process and includes at least one dielectric layer 230, a redistribution layer 231 formed on the dielectric layer 230 and a plurality of blind-via conductors 232 disposed in the dielectric layer 230 and electrically connecting the redistribution layer 231 and the first circuit layer 212, and the outmost redistribution layer 231 is provided with a plurality of electrical contact pads 233, so as to obtain the package substrate 2 of the present disclosure.

In an embodiment, the redistribution layer 231 may be of a fan-out type, and the specification (e.g., line width/line pitch) of the redistribution layer 231 is different from the specification (e.g., line width/line pitch) of the first circuit layer 212. For example, the line width/line pitch of the redistribution layer 231 is less than the line width/line pitch of the first circuit layer 212.

Moreover, the coefficient of thermal expansion (CTE) of the second circuit structure 22 is equal to the overall CTE of the first circuit structure 21 and the wiring structure 23, that is, the CTE of the overall structure on the first side 20*a* of the core board body 20 is equal to the CTE of the overall structure on the second side 20*b* of the core board body 20.

Furthermore, the material for forming the redistribution layer 231 may be copper, and the material for forming the dielectric layer 230 may be polybenzoxazole (PBO), polyimide (PI), prepreg (PP), or other materials. It should be understood that the material of the dielectric layer 230 may be the same or different from the material of the first insulating layer 211 and the second insulating layers 221, 223, 225.

Therefore, the fabricating method of the present disclosure is to fabricate the wiring structure 23 by the RDL process to facilitate the formation of the redistribution layer 231 with a very small line width/line pitch. Consequently, the package substrate 2 of the present disclosure can have an ultra-fine pitch wiring specification to facilitate the external connection of miniaturized semiconductor chips with multiple contacts.

Moreover, the fabricating method of the present disclosure can effectively balance the CTE of the overall structure on the first side 20*a* of the core board body 20 and the CTE of the overall structure on the second side 20*b* of the core board body 20 by the design of the wiring structure 23. Hence, compared to the prior art, the fabricating method of the present disclosure can not only prevent the warpage from occurring to the package substrate 2, but also only need to use the common dielectric material to fabricate the first insulating layer 211 and the second insulating layers 221, 223, 225, and does not need to use a buffer material to fabricate the first insulating layer 211 or does not need to add a buffer layer on the first side 20*a*. As a result, the fabricating method of the present disclosure not only saves material costs, but also meets the requirements of the flatness of the first insulating layer 211 and the flatness of the second insulating layers 221, 223, 225 under the same equipment so as to improve the accuracy of the wiring positions, thereby enhancing the reliability of the subsequent packaging of semiconductor chips.

Furthermore, the fabricating method of the present disclosure bonds the first insulating layer 211 and the second insulating layers 221, 223, 225 having the same material as the first insulating layer 211 with the core board body 20 by pressing or laminating, so as to facilitate the formation of the first insulating layer 211 and the second insulating layers 221, 223, 225 with uniform surface flatness. Therefore, compared to the prior art, the fabricating method of the present disclosure does not require brushing and/or grinding operations, and thus not only prevents the problem of structural deformation from occurring to the package substrate 2 during the fabricating process, but also eliminates the problem of internal circuit breakage due to the stress generated by brushing and grinding, and reduces the cost of fabrication because no brushing and grinding equipment is required.

In addition, in the fabrication method of the present disclosure, the first insulating layer 211 covers the first circuit layer 212 in a manner of pressing/laminating, such that the first circuit layer 212 is embedded in the first insulating layer 211, and such that the surface 212*a* of the first circuit layer 212 is flush with the surface 211*a* of the first insulating layer 211 after removal of the carrier 9. Therefore, the fabricating method of the present disclosure facilitates the RDL process by the flatness of the surface of the embedded circuit structure. For example, when the surface 212*a* of the first circuit layer 212 is flush with the surface 211*a* of the first insulating layer 211, the photosensitive PI film or liquid PI material used in the dielectric layer 230 can be easily formed on the flat surface 211*a*, 212*a* of the first circuit structure 21 (see e.g., FIG. 2E), and the flatness of the dielectric layer 230 meets the requirements.

The present disclosure also provides a package substrate 2, which comprises: a core board body 20 having a first side 20*a* and a second side 20*b* opposing the first side 20*a*, a first circuit structure 21 disposed on the first side 20*a* of the core board body 20, a second circuit structure 22 disposed on the second side 20*b* of the core board body 20, and a wiring structure 23 disposed on the first circuit structure 21.

The core board body 20 has a plurality of conductive vias 200 communicating with the first side 20*a* and the second side 20*b*.

The first circuit structure 21 has at least one first insulating layer 211 and a first circuit layer 212 embedded in the first insulating layer 211, wherein the first circuit layer 212 is electrically connected to the conductive vias 200.

The second circuit structure 22 has at least one second insulating layer 221, 223, 225 and second circuit layers 222, 224, 226 bonded with the second insulating layers 221, 223, 225, wherein the second circuit layers 222, 224, 226 are electrically connected to the conductive vias 200, wherein a specification of the first circuit structure 21 is the same as a specification of the second circuit structure 22, and a number of wiring layers of the second circuit structure 22 is greater than a number of wiring layers of the first circuit structure 21.

The wiring structure 23 has at least one dielectric layer 230 and a redistribution layer 231 bonded with the dielectric layer 230, wherein the redistribution layer 231 is electrically connected to the first circuit structure 21, wherein a specification of the wiring structure 23 is different from the specification of the first circuit structure 21.

In one embodiment, a specification of the redistribution layer 231 is different from a specification of the first circuit layer 212, and specifications of the second circuit layers 222, 224, 226 are the same as the specification of the first circuit layer 212.

Furthermore, a surface 211*a* of the first insulating layer 211 is flush with a surface 212*a* of the first circuit layer 212.

In an embodiment, the specification is a line width and/or a line pitch.

In an embodiment, a coefficient of thermal expansion of the second circuit structure 22 is greater than a coefficient of thermal expansion of the first circuit structure 21.

To sum up, in the package substrate and the fabricating method thereof of the present disclosure, the warping problem of an asymmetric package substrate due to the uneven distribution of stress is prevented by placing the RDL-type wiring structure on the first circuit structure. As such, the present disclosure not only meets the requirements of fine pitch and fine line, but also enhances reliability, thereby improving the yield rate of end electronic products and reducing the fabricating cost.

The foregoing disclosure has included specific embodiments. However, it will be apparent to one of skill in the art that other variations and modifications may be made to the described embodiments, with the attainment of some or all of their advantages. Accordingly this disclosure is to be taken only by way of example and is not intended to otherwise limit the scope of the embodiments herein. Therefore, it is the object of the appended claims to cover all such variations and modifications as come within the true spirit and scope of the embodiments herein.

What is claimed is:

1. A package substrate, comprising:

a core board body having a first side, a second side opposing the first side, a first inner circuit layer and a second inner circuit layer protruding from the first side and the second side respectively, and a plurality of conductive vias electrically connecting the first inner circuit layer and the second inner circuit layer;

a first circuit structure disposed on the first side of the core board body and electrically connected to the first inner circuit layer; wherein the first circuit structure comprises a first insulating layer and a first circuit layer embedded in the first insulating layer, and a surface of the first circuit layer is flush with a surface of the first insulating layer;

a second circuit structure disposed on the second side of the core board body and electrically connected to the second inner circuit layer, wherein the second circuit structure comprises a plurality of second insulating layers and a plurality of second circuit layers bonded to the second insulating layers, the plurality of second circuit layers protrudes from the plurality of second insulating layers; a number of wiring layers of the second circuit structure is greater than a number of wiring layers of the first circuit structure, and a line width and a line pitch of the first circuit structure are the same as a line width and a line pitch of the second circuit structure; and a wiring structure disposed on the first circuit structure, wherein the wiring structure comprises at least one dielectric layer, a redistribution layer bonded with the dielectric layer, and a plurality of blind-via conductors disposed in the dielectric layer and electrically connecting the redistribution layer and the first circuit layer; a line width and a line pitch of the wiring structure are different from the line width and the line pitch of the first circuit structure; wherein a coefficient of thermal expansion of the second circuit structure is equal to a coefficient of thermal expansion of the first circuit structure with the wiring structure as a whole.

2. The package substrate of claim 1, wherein a line width and a line pitch of the redistribution layer are different from a line width and a line pitch of the first circuit layer, and a line width and a line pitch of the second circuit layer are the same as the line width and the line pitch of the first circuit layer.

3. A method of fabricating a package substrate, the method comprising:

forming a first circuit layer on a carrier;

forming a first insulating layer and a core board body sequentially on the carrier, wherein the first insulating layer is bonded with the carrier to cover the first circuit layer, and the first circuit layer is embedded in the first insulating layer, wherein the core board body has a first side and a second side opposing the first side, the first side of the core board body is bonded with the first insulating layer, and the core board body has a first inner circuit layer and a second inner circuit layer protruding from the first side and the second side respectively, and a plurality of conductive vias electrically connecting the first inner circuit layer and the second inner circuit layer; wherein a surface of the first insulating layer is flush with a surface of the first circuit layer;

forming a second circuit structure on the second side of the core board body, wherein the second circuit structure has a plurality of second insulating layers and a plurality of second circuit layers bonded with the second insulating layer, and the second circuit layer is electrically connected to the second inner circuit layer; wherein the plurality of second circuit layers protrudes from the plurality of second insulating layers;

the core board body, the first insulating layer and the second insulating layer are formed on the carrier in a press-fit manner;

removing the carrier to expose the first circuit layer and the first insulating layer;

forming a first circuit structure electrically connected to the first inner circuit layer by the first insulating layer and the first circuit layer, wherein a line width and a line pitch of the first circuit layer is the same as a line width and a line pitch of the second circuit layer, and a number of wiring layers of the first circuit layer is less than a number of wiring layers of the second circuit layer; and forming a wiring structure on the first circuit structure, wherein the wiring structure has at least one dielectric layer, a redistribution layer bonded with the dielectric layer and a plurality of blind-via conductors disposed in the dielectric layer and electrically connecting the redistribution layer and the first circuit layer, and a line width and a line pitch of the redistribution layer is different from the line width and the line pitch of the first circuit layer; wherein a coefficient of thermal expansion of the second circuit structure is equal to a coefficient of thermal expansion of the first circuit structure with the wiring structure as a whole.

* * * * *